United States Patent
Kishino et al.

(10) Patent No.: US 7,466,073 B2
(45) Date of Patent: Dec. 16, 2008

(54) ORGANIC ELECTROLUMINESCENT DEVICE AND DISPLAY APPARATUS

(75) Inventors: Kengo Kishino, Yokohama (JP); Shinjiro Okada, Kamakura (JP); Satoshi Igawa, Fujisawa (JP); Masashi Hashimoto, Kawasaki (JP); Hironobu Iwawaki, Yokohama (JP); Minako Kurokawa, Kawasaki (JP); Jun Kamatani, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 637 days.

(21) Appl. No.: 11/235,117

(22) Filed: Sep. 27, 2005

(65) Prior Publication Data

US 2006/0066225 A1    Mar. 30, 2006

(30) Foreign Application Priority Data

Sep. 29, 2004   (JP)   ............................. 2004-283239
Sep. 9, 2005    (JP)   ............................. 2005-261940

(51) Int. Cl.
*H01J 1/62*   (2006.01)
*H01J 63/04*  (2006.01)

(52) U.S. Cl. ..................... 313/504; 313/506; 428/690; 428/917

(58) Field of Classification Search ................. 313/504, 313/506; 428/690, 917
See application file for complete search history.

(56) References Cited

U.S. PATENT DOCUMENTS

| | | | |
|---|---|---|---|
| 6,838,818 B2 | 1/2005 | Furugori et al. | 313/504 |
| 6,929,873 B2 | 8/2005 | Tsuboyama et al. | 428/690 |
| 7,265,163 B2 * | 9/2007 | O'Neill et al. | 522/168 |
| 2002/0146589 A1 | 10/2002 | Akiyama et al. | 428/690 |
| 2003/0141809 A1 | 7/2003 | Furugori et al. | 313/504 |
| 2004/0013905 A1 | 1/2004 | Tsuboyama et al. | 428/690 |
| 2005/0035707 A1 | 2/2005 | Furugori et al. | 313/504 |
| 2005/0048314 A1 * | 3/2005 | Antoniadis et al. | 428/690 |
| 2005/0077817 A1 * | 4/2005 | Yamazaki et al. | 313/504 |
| 2005/0084710 A1 | 4/2005 | Kishino et al. | 428/690 |

FOREIGN PATENT DOCUMENTS

JP   2002-50483   2/2002

* cited by examiner

*Primary Examiner*—Sumati Lefkowitz
*Assistant Examiner*—Ke Xiao
(74) *Attorney, Agent, or Firm*—Fitzpatrick, Cella, Harper & Scinto (57) ABSTRACT

The present invention provides a phosphorescent luminescent device which has high-efficiency and a long lifetime. The organic electroluminescent device according to the present invention includes a pair of electrodes and an organic layer disposed between the pair of electrodes, wherein the organic layer has at least a light-emitting layer, and the light-emitting layer include at least a host material and dopants containing at least a first dopant and a second dopant, and wherein a triplet lowest excitation level of the first dopant is higher than a triplet lowest excitation level of the host material, and a triplet lowest excitation level of the second dopant is lower than a triplet lowest excitation level of the host material.

15 Claims, 2 Drawing Sheets

ORGANIC ELECTROLUMINESCENT DEVICE AND DISPLAY APPARATUS

BACKGROUND OF THE INVENTION

1. Field of the Invention

The present invention relates to an organic electroluminescent device and a display apparatus including a plurality thereof.

2. Related Background Art

Recent years have seen progress in the development of organic electroluminescent devices (hereinafter, referred to as "organic EL device").

Organic EL devices have at least one organic layer between electrodes. The organic layer includes at least a light-emitting layer, wherein the organic layer structure can be, for example, a three-layer structure consisting of a hole-transporting layer, a light-emitting layer and an electron-transporting layer, or a two-layer structure consisting of a hole-transporting layer and a light-emitting layer.

Japanese Patent Application Laid-Open No. 2002-050483 (corresponding to U.S. Patent Application Publication No. 2002/0146589) discloses a light-emitting layer which has three kinds of organic compound. The paragraphs [0038] and [0039] referring to FIG. 3 of Japanese Patent Application Laid-Open No. 2002-050483 (corresponding to the paragraphs [0048] and [0049] referring to FIG. 3 of U.S. Patent Application Publication No. 2002/0146589) describes the following.

An energy transfer takes place from the lowest excitation singlet state of the third organic compound to the lowest excitation singlet state of the first organic compound, and transits to the lowest triplet state by intersystem crossing. Further, an energy transfer takes place from the lowest excitation triplet state of the third organic compound to the lowest excitation triplet state of the first organic compound. Thereafter, an energy transfer takes place from the lowest excitation triplet state of the first organic compound to the second lowest excitation triplet state of the second organic compound, and after the transition to the lowest excitation singlet state by reverse intersystem crossing, fluorescence is emitted in the process of returning to the ground state.

The quantitative relationship among the first, second and third organic compounds of Japanese Patent Application Laid-Open No. 2002-050483 is unclear. More specifically, Examples in this application disclose that a first organic compound is a phosphorescent material which does not emit light and a second compound is a fluorescent material which does emit light. Further, it is disclosed in the Examples that the proportion of these two compounds is respectively 0.02 mg and 0.10 mg, whereby it is understood that there is more of the fluorescent material which emits light. However, Japanese Patent Application Laid-Open No. 2002-050483, does not clearly specifies as to what the third compound is, and whether the third compound is quantitatively greater than the first and second compounds. Therefore, there is no basis for supposing that the light-emitting layer containing these first, second and third compounds is a so-called host-guest type light-emitting layer.

In addition, the organic EL device described in Japanese Patent Application Laid-Open No. 2002-050483 requires further improvements in terms of emission efficiency, as well as lifetime and power consumption as a device.

In view of the above, it is an object of the present invention to provide an organic EL device having greater efficiency and a longer lifetime.

SUMMARY OF THE INVENTION

To achieve the above-described object, the present invention provides an organic electroluminescent device including: a pair of electrodes, and an organic layer disposed between the pair of electrodes, the organic layer having at least a light-emitting layer, wherein the light-emitting layer including at least a host material and dopants containing at least a first dopant and a second dopant, and wherein a triplet lowest excitation level of the first dopant is higher than a triplet lowest excitation level of the host material, and a triplet lowest excitation level of the second dopant is lower than a triplet lowest excitation level of the host material.

According to the present invention, an organic EL device having greater efficiency and a longer lifetime can be provided.

DETAILED DESCRIPTION OF THE PREFERRED EMBODIMENTS

The light-emitting layer of the EL device according to the present invention includes at least a host material and dopants containing least a first dopant and a second dopant.

The first dopant itself is not a dopant having a purpose of emitting light. The first dopant receives energy from the host material to cause intersystem crossing from the singlet lowest excitation state to the triplet lowest excitation state, whereby energy is supplied from the first dopant via the host material to the second dopant. It is not necessary to completely prevent light emission of the first dopant. If necessary, the first dopant can emit light to a certain extent.

The second dopant is a dopant for mainly emitting light, and is a phosphorescent material. Thus, energy needs to be efficiently supplied to the triplet lowest excitation state of the second dopant.

In the present invention, the term "light-emitting layer" means a layer having a light-emitting function among the organic layers provided between the electrodes. The term "host material" means a main component contained in the light-emitting layer. More specifically, the host material is a material contained in the light-emitting layer at 60 weight % or more thereof. The term "dopant" means a material just slightly contained in the light-emitting layer. More specifically, the dopant is a material contained in the light-emitting layer at 40 weight % or less thereof. Therefore, in the present invention the total amount of the first dopant and the second dopant is 40 weight % or less.

In the organic EL device according to the present invention, it is thought that the location where the hole and the electron fed from the pair of electrodes recombine is in the host material. This is because the host material is a main component accounting for a large proportion of the host material. As a result of recombination, the host material singlet lowest excitation state is generated. Energy is initially transferred to the first dopant without being directly transferred from the singlet lowest excitation state of the host material to the triplet lowest excitation state of the second dopant. In the first dopant, the singlet lowest excitation state undergoes intersystem crossing to a triplet lowest excitation state, whereby energy is transferred from the first dopant to the second dopant. The energy is transferred at this time to the second dopant via the host material.

Any of the following points, for example, can be given as advantages of a first dopant.

(1) Selectivity of the host material broadens because it is possible to use a host material having a large difference between its singlet lowest excitation state and triplet lowest excitation state.

(2) Selectivity of the second dopant broadens because of accepting a large difference between the singlet lowest excitation state of the host material and the singlet lowest excitation state of the second dopant.

(3) Selectivity of the second dopant broadens because of accepting a large difference between the singlet lowest excitation state of the host material and the triplet lowest excitation state of the second dopant.

(4) Selectivity of the second dopant broadens because of no necessity of expecting intersystem crossing in the second dopant and because of accepting a large difference between the singlet lowest excitation state and triplet lowest excitation state of the second dopant.

The above advantages make, for example, the following possible. Namely, after specific materials are determined for the host material and the second dopant, a preferable first dopant can be selected for improving efficiency.

Thus, in the present invention, the above-described advantages can be achieved without generating intersystem crossing in a second dopant, and further, without generating intersystem crossing even in the host material, but by generating intersystem crossing in another material (first dopant).

In the present invention, as described above, the transfer of energy from the first dopant is carried out via the host material.

As described above, the host material is the main component of the light-emitting layer. As such, the likelihood that the first dopant and the host material are adjacent is greater than the likelihood that the first dopant and the second dopant are adjacent. Further, the likelihood that the second dopant and the host material are adjacent is greater than the likelihood that the first dopant and the second dopant are adjacent. In the present invention, energy transfer of the triplet excited energy is utilized. In this case, energy transfer is carried out by a Dexter mechanism, wherein the distance of extending energy transfer in the Dexter mechanism is shorter than that in the Forster mechanism which is transfer mechanism of a singlet excited energy. Thus, the transfer of energy from the first dopant to the second dopant can be efficiently carried out via the host material.

Figure 2:
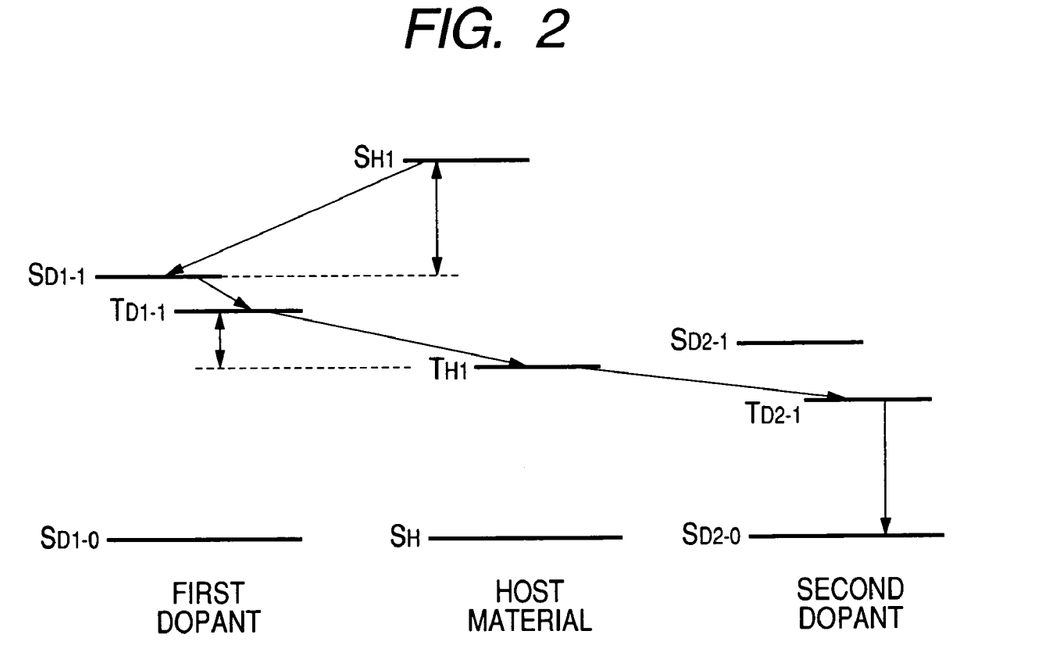
FIG. 2 is a diagram illustrating the lowest excitation level for the host material and each dopant in the organic EL device according to the present invention.

The magnitude correlation between the lowest excitation levels of respective layers for forming the light-emitting layer of the organic EL device according to the present invention will now be described with referring to FIG. 2.

In the present invention, energy which is transferred from the first dopant is preferably transferred to the second dopant via the triplet lowest excitation state of the host material.

Therefore, the magnitude correlation among the host material's singlet lowest excitation level $S_{H1}$, the first dopant's singlet lowest excitation level $S_{D1-1}$, the first dopant's triplet lowest excitation level $T_{D1-1}$ and the host material's triplet lowest excitation level $T_{H1}$ is preferably as follows.

That is, the magnitude correlation is preferably $S_{H1} > S_{D1-1} > T_{D1-1} > T_{H1}$.

In the present invention, energy which is transferred from the host material to the second dopant may be transferred to the singlet lowest excitation level $S_{D2-1}$ of the second dopant, although it is preferable to transfer to the triplet lowest excitation level $T_{D2-1}$ of the second dopant.

In such a case, the magnitude correlation between the host material's triplet lowest excitation level $T_{H1}$ and the second dopant's triplet lowest excitation level $T_{D2-1}$ is preferably as follows.

That is, the magnitude correlation is preferably $T_{H1} > T_{D2-1}$.

In addition, the magnitude correlation is preferably $S_{D2-1} > T_{H1} > T_{D2-1}$.

From the above, the magnitude correlation between the first dopant's triplet lowest excitation level $T_{D1-1}$ and the host material's triplet lowest excitation level $T_{H1}$, and between the host material's triplet lowest excitation level $T_{H1}$ and the second dopant's triplet lowest excitation level $T_{D2-1}$ is preferably as follows.

That is, the magnitude correlation is preferably $T_{D1-1} > T_{H1} > T_{D2-1}$.

In addition, the magnitude correlation between the host material's singlet lowest excitation state $S_{H1}$ and the second dopant's singlet lowest excitation state $S_{D2-1}$ is preferably as follows.

That is, the magnitude correlation is preferably $S_{H1} > S_{D2-1}$.

From the above, the magnitude correlation between the host material's singlet lowest excitation state $S_{H1}$ and the first dopant's singlet lowest excitation state $S_{D1-1}$, and between the host material's singlet lowest excitation state $S_{H1}$ and the second dopant's singlet lowest excitation state $S_{D2-1}$ is preferably as follows.

That is, the magnitude correlation is preferably $S_{H1} > S_{D1-1} > S_{D2-1}$.

In the organic EL device according to the present invention, a difference between the host material's singlet lowest excitation level $S_{H1}$ and the first dopant's singlet lowest excitation level $S_{D1-1}$ is preferably 0.7 eV or less. If the difference between the excitation levels is large, it is thought that the transfer from the host material's singlet lowest excitation level $S_{H1}$ to the first dopant's singlet lowest excitation level $S_{D1-1}$ does not easily occur. For the same reason, the difference between the first dopant triplet lowest excitation level $T_{D1-1}$ and the host material's triplet lowest excitation level $T_{H1}$ is preferably 0.4 eV or less.

The measurement methods for each of the singlet lowest excitation state and triplet lowest excitation state of the host material, the first dopant and the second dopant can be carried out as conducted in the below-described Examples.

In the organic EL device according to the present invention, it is preferable that the overlap between the emission spectrum of the host material and the absorption spectrum of the second dopant is large. This is because that the second dopant can absorb the excited energy from the host material without any loss, whereby the second dopant can efficiently emit light. For the same reason, it is preferable that the overlap between the emission spectrum of the first dopant and the absorption spectrum of the host material is large.

In the organic EL device according to the present invention, the host material is preferably a linear aromatic compound having a plurality of conjugated rings bound thereto. More preferable is a linear aromatic compound which does not have an aromatic substituent in the side direction with respect to the molecular long axis. The molecules of a compound which does not have an aromatic substituent in the side direction are more easily tightly stacked with one another. This allows carrier transfer to occur more easily, whereby the driving current can be reduced. By keeping the driving current low, device lifetime can also be improved. In addition, it is also thought that if the atoms constituting the host molecule only consist of hydrogen atoms and oxygen atoms, device lifetime can be improved. Of course, hetero atoms (nitrogen etc.) can also be contained in the molecule. From the point of maintaining high purity, the host material is preferably a compound composed of a few hundred monomers or less, and more preferably a compound composed of a few monomers, rather than a polymer.

Here, the linear aromatic compound which does not have "an aromatic substituent in the side direction" or "an aromatic side substituent" means a compound which does not have aromatic substituents in the direction different to the molecule long axis direction, for example, a compound which does not have a fused ring structure such as a carbazole ring or an anthracene ring in the direction different to the molecule long axis direction. Examples include, fluorene polymers, such as Compounds 1 to 4 as shown below, which do not have an aromatic substituent on any of the 1-, 4-, 5- and 8-positions except for the 2- and 7-positions of the fluorene ring in the longitudinal direction of the molecule. The term fluorene oligomer is a compound composed of two or more fluorenes bound. Preferably, such a fluorene polymer is a compound composed of two to five fluorenes bound. Alternatively, a preferable fluorene polymer is a compound wherein the long axis of the molecule is constituted from a phenyl ring, fluorene ring, naphthalene ring or a combination thereof. Use of fluorene makes it possible to realize excellent amorphous characteristics and a high glass transition temperature (Tg) of 120° C. or more.

Specific examples of the host material which can be employed in the present invention are illustrated below. However, the present invention is not limited to these examples.

Compound 1

Compound 2

Compound 3

Compound 4

The first dopant is preferably a phosphorescent material in order to conduct intersystem crossing. The second dopant as a main light-emitting material, is a phosphorescent material. Although the phosphorescent materials which can be used as the first and second dopants are not particularly restricted, metal coordination compounds can be preferably selected. Specific examples of such a metal coordination compound include a metal coordination compound having ligands bound to a central metal such as platinum, copper, rhenium, iridium or similar metal. A metal coordination compound having iridium as the central metal is especially preferable. In addition, use of a metal coordination compound in which the ligand main skeleton is phenylisoquinoline or phenylquinoline as the second dopant is preferable for realizing red light emission and also in terms of triplet energy transfer.

It is also preferable to use metal coordination compounds as the first dopant and the second dopant, which have a similar structure to each other. The similar structure means a structure in which the central metals or the ligand structures are the same. Further, the phosphorescence lifetime of at least the second dopant, which is the main light-emitting material, is preferably short, at 1.6 µs or less. This is because it is thought that if the phosphorescence lifetime is long, efficiency tends to decrease due to the triplet-triplet annihilation Only two kinds of dopant are not necessarily used in the light-emitting layer, wherein another dopant may be contained. If another dopant is present, this is acceptable as long as energy transfer is carried out efficiently by the two kinds of dopant and the dopant having the lower triplet excitation level emits light.

Each concentration of the first dopant and second dopant is not especially restricted. However, the concentration of the first dopant is preferably from 0.1 weight % or more to 40 weight % or less, and the concentration of the second dopant is preferably from 0.1 weight % or more to 20 weight % or less, provided that, as stated above, the sum of the first dopant concentration and the second dopant concentration is preferably 40% or less. Here,. the concentration means the ratio of the dopant contained in the light-emitting layer with respect to the total components of the light-emitting layer as the denominator.

Specific examples of dopants which can be used in the present invention are shown below. Although red light-emitting dopants are particularly shown, the present invention is not limited to these examples.

Ir(bq)$_3$

Ir(piq)$_3$

-continued

Ir(4F5mpiq)$_3$

Ir(ppy)$_3$

Ir(4mopiq)$_3$

Ir(dbq)$_3$

-continued

Ir(C6piq)3

Ir(4CF3piq)3

Ir(popiq)3

Ir(4Fppy)3

Ir(5CF3ppy)3

Ir(p-4CF3-py)3

Ir(C8piq)3

Ir(C₂piq)₃

Ir(5Fpiq)₃

Ir(5ppiq)₃

Ir(Fliq)₃

Ir(4Fp5Fiq)₃

Ir(4F5Mp5Fiq)₃

Ir(4Fp4Fiq)₃

Ir(C₄p5Fiq)₃

Ir(4CF₃p5Fiq)₃

Ir(4mpiq)₃

Ir(p5Fiq)₃

Ir(Flpy)₃

-continued

Ir(4F5mp4Fiq)$_3$

Among the above compounds, examples of the first dopant include Ir(ppy)$_3$, Ir(bq)$_3$, Ir(Flpy)$_3$ and the like, and examples of the second dopant include Ir(4mopiq)$_3$, Ir(4CF$_3$piq)$_3$, Ir(4mpiq)$_3$, Ir(piq)$_3$ and the like.

Figure 1A:
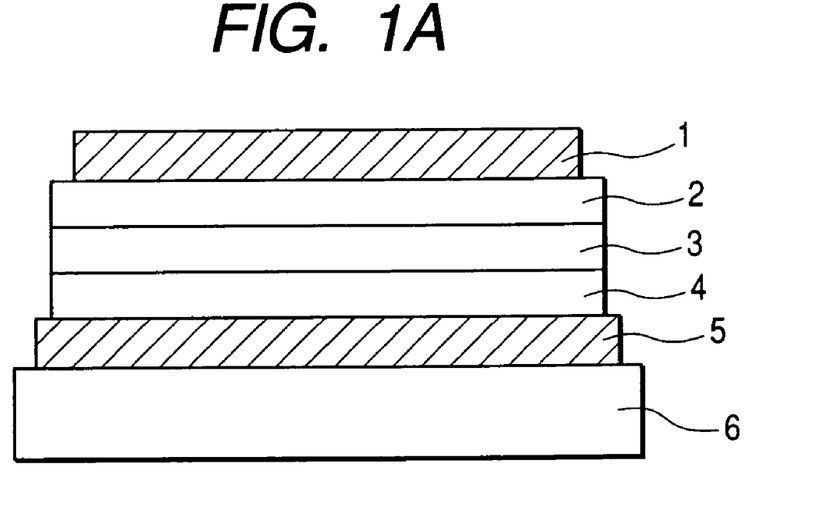
FIGS. 1A and 1B are diagrams illustrating one example of an organic EL device according to the present invention.
Figure 1B:
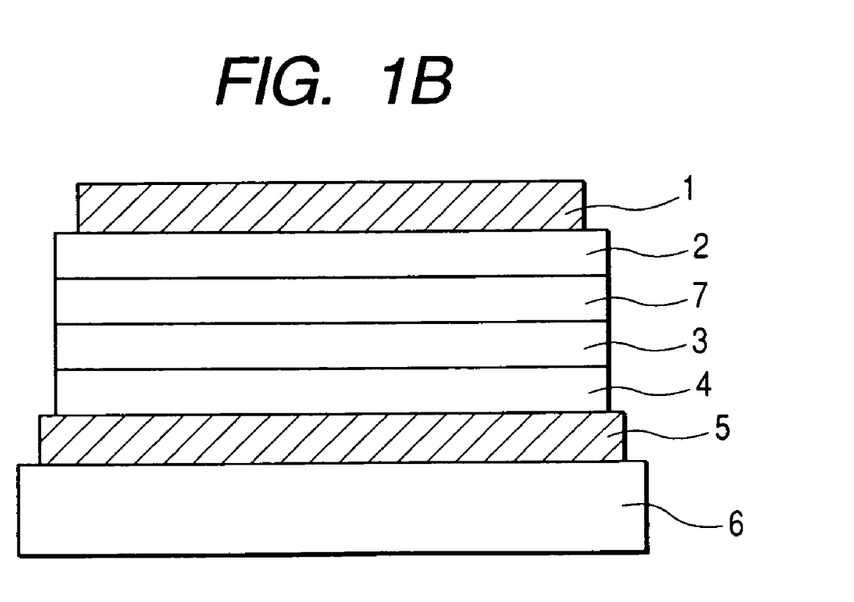

As shown in FIGS. 1A and 1B, the organic layer in the organic EL device according to the present invention can be, for example, a three-layer or four-layer structure. FIGS. 1A and 1B are schematically cross-sectional views of the light-emitting luminescent device according to the present invention. In FIGS. 1A and 1B, reference numeral 1 denotes a metal electrode, reference numeral 2 denotes an electron-transporting layer, reference numeral 3 denotes a light-emitting layer, reference numeral 4 denotes a hole-transporting layer, reference numeral 5 denotes a transparent electrode, reference numeral 6 denotes a transparent substrate and reference numeral 7 denotes an exciton diffusion blocking layer.

At least one of the electrodes is preferably transparent. The electrodes can be selected as appropriate in consideration of electron injection characteristics and hole injection characteristics. The materials of a transparent electrode include ITO and IZO. Other materials of the electrodes which can be used include a metal such as aluminum, gold, platinum, chromium, copper, and an alloy containing at least one of such metals.

If necessary, the organic EL device according to the present invention is also preferably designed to be isolated from oxygen and moisture. The device of the present invention can be sealed with, for example, a sealing can or a sealing film which contains at least one of an organic substance and an inorganic substance.

The organic EL device according to the present invention is especially preferably used as a red light emission device. The organic EL device according to the present invention can also be used as a green or blue light-emitting device, and even used as a white light-emitting device.

The organic EL device according to the present invention can be used in a display apparatus such as a display. The organic EL device according to the present invention can be used for, for example, the pixel portion or subpixel portion of a display. The display as used here means a display apparatus which is mounted on a television, computer, digital camera, camcorder or the like, or a display apparatus mounted on a vehicle. The present light-emitting device can also be used as an illuminant, as the display in an electrophotographic system image forming apparatus, or as the exposure source in a photosensitive member.

The organic EL device according to the present invention can be used singly or used in plural. When there are a plurality of organic EL devices, light can be emitted by, for example, passive driving or active matrix driving. In addition, when there are a plurality of organic EL devices, the respective devices may be monochromic or heterochromic. When the organic EL devices are heterochromic, full-color light emission can be achieved. The organic EL device according to the present invention may be a device, which emits out light from a substrate side, having a so-called bottom emission structure, or a device, which emits light from the side opposite to the substrate, having a so-called top emission structure.

EXAMPLE 1

In the present Example, an organic EL device having three organic layers as shown in FIG. 1A was fabricated as the device structure.

On a glass substrate serving as the transparent substrate 6, ITO having a thickness of 100 nm was patterned to form a plurality of transparent electrodes 5 each having an electrode surface area of 3 mm$^2$. On the obtained ITO substrate, organic layers and electrode layers as described below were then continuously grown by vacuum deposition utilizing resistance heating under 10$^{-5}$ Pa in a vacuum chamber. The lowest excitation levels of the host material and respective dopants are shown in Table 1. The lowest excitation level of the host material and respective dopants shown in Table 1 were measured using the following method.

A host 100% film and a dopant 100% film were formed on a quartz substrate, and then using a spectrophotometer (manufactured by Hitachi High-Technologies Corporation), emission peak energy was measured during excitation using a xenon lamp. At this time, peak energy having a delayed emission component of 2 ms or more was taken to be a triplet lowest excitation level, and peak energy having a fast emission component of 2 ms or less was taken to be a singlet lowest excitation level.

However, among the host materials, Compound 1 and Compound 3, in which phosphorescence was not easily observed, were made to contain about 20% of Ir(ppy)$_3$ to boost phosphorescence, whereby phosphorescence of the host material was caused by intersystem crossing. At this time, the host material and Ir(ppy)$_3$ was cooled to the temperature of liquid nitrogen, wherein the delayed emission component was measured and taken to be the triplet lowest excitation level.

The singlet lowest excitation level of the iridium complex as the dopant was not measured using a spectrophotometer, but was calculated from the wave form of the lowest peak or shoulder having a molar extinction coefficient having approximately 2,000 M⁻¹ cm⁻¹ or more from light absorption measurement.

Hole-transporting layer 4 (20 nm): FL03
Light-emitting layer 3 (50 nm): [host material]
Compound 1, [first dopant (concentration: 16 wt %]
Ir(ppy)$_3$, [second dopant (concentration: 4 wt %] Ir(4mopiq)$_3$
Electron-transporting layer 2 (30 nm): Bphen
Metal electrode layer 1 (1 nm): KF
Metal electrode layer 1 (100 nm): Al

FL03

Bphen

The obtained EL device were measured with respect to efficiency (cd/A at 600 cd/M²), chromaticity (x, y) (measured using a BM-7 manufactured by Topcon Corporation), Vth (voltage when a current density of 0.1 mA/cm² flows), and luminance half hour (hr) when driven at 100 mA/cm². The results are shown in Table 2.

EXAMPLES 2 TO 4 AND COMPARATIVE EXAMPLES 1 TO 3

Organic EL devices were fabricated in the same manner as in Example 1, except that the host material and dopants in the light-emitting layer were changed to those shown in Table 1. The obtained devices were evaluated in the same manner as in Example 1. The results are shown in Table 2.

TABLE 1

| | Host Material | | First dopant | | | Second Dopant | | |
|---|---|---|---|---|---|---|---|---|
| | Compound | $T_{H1}/S_{H1}$(eV) | Compound | $T_{d1-1}/S_{d1-1}$(eV) | Concentration (wt %) | Compound | $T_{d2-1}/S_{d2-1}$(eV) | Concentration (wt %) |
| Example 1 | Compound 1 | 2.16/2.98 | Ir(ppy)$_3$ | 2.43/2.58 | 16 | Ir(4mopiq)$_3$ | 2.03/2.25 | 4 |
| Comparative Example 1 | Compound 1 | 2.16/2.98 | — | — | — | Ir(4mopiq)$_3$ | 2.03/2.25 | 4 |
| Example 2 | Compound 1 | 2.16/2.98 | Ir(ppy)$_3$ | 2.43/2.58 | 16 | Ir(piq)$_3$ | 2.00/2.17 | 4 |
| Comparative Example 2 | Compound 1 | 2.16/2.98 | — | — | — | Ir(piq)$_3$ | 2.00/2.17 | 4 |
| Example 3 | Compound 1 | 2.16/2.98 | Ir(Flpy)$_3$ | 2.28/2.37 | 16 | Ir(4mopiq)$_3$ | 2.03/2.25 | 4 |
| Example 4 | Compound 3 | 2.25/3.18 | Ir(ppy)$_3$ | 2.43/2.58 | 16 | Ir(4mopiq)$_3$ | 2.03/2.25 | 4 |
| Comparative Example 3 | CBP | 2.67/3.40 | Ir(ppy)$_3$ | 2.43/2.58 | 16 | Ir(4mopiq)$_3$ | 2.03/2.25 | 4 |

TABLE 2

| | Efficiency | | Chromaticity | | Vth | | Luminance half hour | |
|---|---|---|---|---|---|---|---|---|
| | cd/A | Evaluation | (x, y) | Evaluation | V | Evaluation | hr | Evaluation |
| Example 1 | 16.5 | ○ | 0.66, 0.34 | ○ | 2.82 | ○ | 150 | ○ |
| Comparative Example 1 | 10.0 | ○ | 0.64, 0.34 | x | 2.82 | ○ | 60 | x |
| Example 2 | 8.0 | ○ | 0.68, 0.32 | ○ | 2.90 | ○ | 720 | ○ |
| Comparative Example 2 | 6.2 | x | 0.68, 0.32 | ○ | 2.95 | ○ | 800 | ○ |
| Example 3 | 13.6 | ○ | 0.65, 0.34 | ○ | 2.85 | ○ | 100 | ○ |
| Example 4 | 16.7 | ○ | 0.65, 0.35 | ○ | 2.96 | ○ | 180 | ○ |
| Comparative Example 3 | 21.1 | ○ | 0.57, 0.41 | x | 3.24 | x | 700 | ○ |

In the "Evaluation" column of Table 2, the reference character "o" means "most preferable" in terms of practical use, and the reference character "o" is better in evaluation than the reference character "x". The reference character "x " means "practically unsuitable" because of not satisfying the efficiency, chromaticity, driving voltage and lifetime necessary for the organic EL device.

As the evaluation of the efficiency of the device in Table 2, when taking the efficiency of the device of Comparative Example 1, which is not doped with the first dopant as a reference, i.e. which is doped with only Ir(4mopiq)$_3$, "o" was given for the efficiency of 10 cd/A or more. However, concerning Example 2 and Comparative example 2 in which the second dopant was Ir(piq)$_3$, "o" was given for the efficiency of the device higher than that of the device doped with only the second dopant of Ir(piq)$_3$.

Regarding the evaluation of chromaticity in Table 2, from the NTSC red standard, "o" was given for the chromaticity of x=0.65 or more and y=0.35 or more.

Regarding the evaluation of Vth, since a lower current driving is preferable, "o" was given for the Vth of 3 V or less.

Regarding the evaluation of the luminance half hour (device lifetime), "o" was given for the luminance half hour of less than 100 hours, and "x" was given for the luminance half hour of 100 hours or more.

Comparing Example 1 and Comparative Example 1, the device of Example 1 which was doped with the first dopant Ir(ppy)$_3$ was improved in luminance efficiency, cromacity and device lifetime. That is, by doping with a dopant satisfying the relationship of $T_{d1-1}>T_{H1}>T_{d2-1}$, energy transfer was carried out efficiently, whereby initial characteristics and device lifetime were improved. This was the same for the results of Example 2 and Comparative Example 2, whereby it was found that a dopant satisfying the relationship of $T_{d1-1}>T_{H1}>T_{d2-1}$ improved all characteristics (efficiency, chromaticity, Vth and lifetime) regardless of the material of the second dopant.

Comparing Example 1 and Comparative Example 3, although efficiency was very high in the device of Comparative Example 3 in which CBP was used as the host material, Ir(ppy)$_3$ emitted green light. In contrast, the device of Example 1 using Compound 1, in which light emission was relied on only Ir(4mopiq)$_3$, was improved in chromaticity. Furthermore, threshold voltage Vth lowered. This improvement is thought to be due to the use of a linear aromatic compound that did not have aromatic side substituents as the host material, whereby the HOMO and LUMO of the host material were closer to the dopant of Ir complex, thereby increasing mobility. Since a similar decrease in threshold voltage could also be seen from the results of Example 3, it was found that linear aromatic compounds without aromatic side substituents cause threshold voltage to drop.

In addition, from Example 3 it was found that when the relationship of $T_{d1-1}>T_{H1}>T_{d2-1}$ was satisfied, efficiency, chromaticity, Vth and device lifetime were improved regardless of the first dopant material.

Comparing the devices of Examples 1 to 4 which contained a first dopant having a triplet lowest excitation level higher than $T_{H1}$, with the device of Comparative Example 3 which contained a first dopant having a triplet lowest excitation level lower than $T_{H1}$, it was found that the chromaticity and Vth of each device of Examples 1 to 4 were improved, and that all characteristics (efficiency, chromaticity, Vth and lifetime) of the devices of Examples 1 to 4 were evaluated as "o".

From this, it can be seen that when the relationship $T_{d-1}>T_H>T_{d2-1}$ is satisfied, energy transfer from the first dopant can be efficiently carried out, whereby device lifetime and driving voltage improve without any change in chromaticity.

This application claims priority from Japanese Patent Application Nos. 2004-283239 filed Sep. 29, 2004 and 2005-261940 filed Sep. 9, 2005, which are hereby incorporated by reference herein.

What is claimed is:

1. An organic electroluminescent device comprising:
a pair of electrodes, and
an organic layer disposed between the pair of electrodes, the organic layer having at least a light-emitting layer,
wherein the light-emitting layer comprises a host material and dopants containing at least a first dopant and a second dopant, and
wherein a triplet lowest excitation level of the first dopant is higher than a triplet lowest excitation level of the host material, and a triplet lowest excitation level of the second dopant is lower than the triplet lowest excitation level of the host material.

2. The organic electroluminescent device according to claim 1, wherein a singlet lowest excitation level of the host material is higher than a singlet lowest excitation level of the first dopant.

3. The organic electroluminescent device according to claim 1, wherein the host material is a linear aromatic compound with a single molecular weight which does not have an aromatic side substituent.

4. The organic electroluminescent device according to claim 1, wherein the host material is a fluorene polymer.

5. The organic electroluminescent device according to claim 1, wherein the second dopant is a light-emitting material which emits red light.

6. The organic electroluminescent device according to claim 1, wherein the second dopant is a light-emitting material which emits blue light.

7. A display apparatus comprising a plurality of organic electroluminescent devices according to claim 1.

8. An organic electroluminescent device comprising:
a pair of electrodes, and
an organic layer disposed between the pair of electrodes, the organic layer having at least a light-emitting layer,
wherein the light-emitting layer comprises a host material and dopants containing at least a first dopant and a second dopant, and
wherein the first dopant is a dopant which receives energy from the host material to cause intersystem crossing from a singlet lowest excitation state to a triplet lowest excitation state, whereby energy is supplied from the first dopant to the second dopant via the host material, and
wherein the second dopant is a phosphorescent material.

9. The organic electroluminescent device according to claim 8, wherein a singlet lowest excitation level of the host material is higher than a singlet lowest excitation level of the first dopant.

10. The organic electroluminescent device according to claim 9, wherein a triplet lowest excitation level of the first dopant is higher than a triplet lowest excitation level of the host material, and a triplet lowest excitation level of the second dopant is lower than a triplet lowest excitation level of the host material.

11. The organic electroluminescent device according to claim 8, wherein the host material is a linear aromatic compound with a single molecular weight which does not have an aromatic side substituent.

12. The organic electroluminescent device according to claim 8, wherein the host material is a fluorene polymer.

13. The organic electroluminescent device according to claim 8, wherein the second dopant is a light-emitting material which emits red light.

14. The organic electroluminescent device according to claim 8, wherein the second dopant is a light-emitting material which emits blue light.

15. A display apparatus comprising a plurality of organic electroluminescent devices according to claim 8.

\* \* \* \* \*